United States Patent
Choi et al.

(10) Patent No.: US 8,320,485 B2
(45) Date of Patent: *Nov. 27, 2012

(54) VSB TRANSMISSION SYSTEM

(75) Inventors: In Hwan Choi, Gyeonggi-do (KR);
Young Mo Gu, Seoul (KR); Kyung Won Kang, Seoul (KR); Kook Yeon Kwak, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 81 days.

This patent is subject to a terminal disclaimer.

(21) Appl. No.: 12/564,001

(22) Filed: Sep. 21, 2009

(65) Prior Publication Data

US 2010/0007785 A1    Jan. 14, 2010

Related U.S. Application Data

(63) Continuation of application No. 11/767,411, filed on Jun. 22, 2007, now Pat. No. 7,613,246, which is a continuation of application No. 10/898,465, filed on Jul. 23, 2004, now Pat. No. 7,298,786, which is a continuation of application No. 09/968,083, filed on Oct. 1, 2001, now Pat. No. 7,460,606.

(30) Foreign Application Priority Data

Oct. 2, 2000    (KR) .............................. 10-2000-57823

(51) Int. Cl.
*H04L 23/02*    (2006.01)
(52) U.S. Cl. ........ 375/265; 375/260; 375/341; 375/262; 714/792; 714/796
(58) Field of Classification Search .................. 375/265, 375/341, 262, 260; 714/796, 792
See application file for complete search history.

(56) References Cited

U.S. PATENT DOCUMENTS

| | | | |
|---|---|---|---|
| 4,980,897 | A | 12/1990 | Decker et al. |
| 5,087,975 | A | 2/1992 | Citta et al. |
| 5,233,630 | A | 8/1993 | Wolf |
| 5,309,290 | A | 5/1994 | Sugiyama et al. |
| 5,398,073 | A | 3/1995 | Wei |

(Continued)

FOREIGN PATENT DOCUMENTS

KR    10-1997-0056904    7/1997

(Continued)

OTHER PUBLICATIONS

Advanced Television Systems Committee (ATSC), "ATSC Digital Television Standard," ATSC Doc. A/53, Sep. 1995.

(Continued)

*Primary Examiner* — Eva Puente
(74) *Attorney, Agent, or Firm* — Lee, Hong, Degerman, Kang & Waimey

(57) ABSTRACT

A vestigial sideband (VSB) modulation transmission system and a method for encoding an input signal in the system are disclosed. According to the present invention, the VSB transmission system includes a convolutional encoder for encoding an input signal, a trellis-coded modulation (TCM) encoder for encoding the convolutionally encoded signal, and a signal mapper mapping the trellis-coded signal to generate a corresponding output signal. Different types of the convolutional encoders are explored, and the experimental results showing the performances of the VSB systems incorporating each type of encoders reveals that a reliable data transmission can be achieved even at a lower input signal to noise ratio when a convolutional encoder is used as an error-correcting encoder in a VSB system.

4 Claims, 7 Drawing Sheets

U.S. PATENT DOCUMENTS

| | | | |
|---|---|---|---|
| 5,488,691 A | 1/1996 | Fuoco et al. | |
| 5,555,024 A | 9/1996 | Limberg | |
| 5,563,884 A | 10/1996 | Fimoff et al. | |
| 5,583,889 A | 12/1996 | Citta et al. | |
| 5,600,677 A | 2/1997 | Citta et al. | |
| 5,602,595 A | 2/1997 | Citta et al. | |
| 5,629,958 A | 5/1997 | Willming | |
| 5,636,251 A | 6/1997 | Citta et al. | |
| 5,636,252 A | 6/1997 | Patel et al. | |
| 5,686,966 A | 11/1997 | Cierva | |
| 5,692,013 A | 11/1997 | Koslov et al. | |
| 5,694,419 A | 12/1997 | Lawrence et al. | |
| 5,706,312 A | 1/1998 | Wei | |
| 5,757,861 A | 5/1998 | Lim | |
| 5,831,690 A | 11/1998 | Lyons et al. | |
| 5,894,549 A * | 4/1999 | Cheng | 714/42 |
| 5,909,454 A | 6/1999 | Schmidt | |
| 5,910,967 A | 6/1999 | Vanderaar | |
| 5,923,711 A | 7/1999 | Willming | |
| 5,946,047 A | 8/1999 | Levan | |
| 5,953,376 A | 9/1999 | Wei | |
| 5,991,341 A | 11/1999 | Shin | |
| 6,040,867 A | 3/2000 | Bando et al. | |
| 6,075,569 A | 6/2000 | Lee et al. | |
| 6,118,825 A | 9/2000 | Ikeda et al. | |
| 6,122,015 A | 9/2000 | Al-Dhahir et al. | |
| 6,141,384 A | 10/2000 | Wittig et al. | |
| 6,178,209 B1 | 1/2001 | Hulyalkar et al. | |
| 6,184,921 B1 | 2/2001 | Limberg | |
| 6,201,563 B1 | 3/2001 | Rhee | |
| 6,201,564 B1 | 3/2001 | Limberg | |
| 6,208,643 B1 | 3/2001 | Dieterich et al. | |
| 6,278,743 B1 | 8/2001 | Templin | |
| 6,490,002 B1 | 12/2002 | Shintani | |
| 6,493,043 B1 | 12/2002 | Bollmann et al. | |
| 6,493,402 B1 | 12/2002 | Fimoff | |
| 6,519,298 B1 | 2/2003 | Kim | |
| 6,529,558 B1 | 3/2003 | Fimoff et al. | |
| 6,690,738 B1 * | 2/2004 | Swenson et al. | 375/265 |
| 6,697,098 B1 | 2/2004 | Wang | |
| 6,708,149 B1 | 3/2004 | Turin | |
| 6,724,439 B1 | 4/2004 | Horwitz | |
| 6,724,832 B1 | 4/2004 | Hershberger | |
| 6,738,949 B2 | 5/2004 | Senda et al. | |
| 6,743,025 B2 | 6/2004 | Howard | |
| 6,744,822 B1 | 6/2004 | Gaddam et al. | |
| 6,760,077 B2 | 7/2004 | Choi et al. | |
| 6,785,903 B1 | 8/2004 | Kuh | |
| 6,788,710 B1 | 9/2004 | Knutson et al. | |
| 6,810,084 B1 | 10/2004 | Jun et al. | |
| 6,810,090 B1 | 10/2004 | Perlow | |
| 6,876,623 B1 | 4/2005 | Lou et al. | |
| 6,888,840 B1 | 5/2005 | Ramaswamy et al. | |
| 6,947,487 B2 | 9/2005 | Choi et al. | |
| 6,958,781 B2 | 10/2005 | Fimoff | |
| 6,996,133 B2 | 2/2006 | Bretl et al. | |
| 7,073,116 B1 | 7/2006 | Settle et al. | |
| 7,197,685 B2 | 3/2007 | Limberg | |
| 7,215,714 B2 | 5/2007 | Bretl et al. | |
| 7,755,704 B2 | 7/2010 | Choi et al. | |
| 7,787,053 B2 | 8/2010 | Choi et al. | |
| 7,787,054 B2 | 8/2010 | Choi et al. | |
| 2001/0036232 A1 | 11/2001 | Betts et al. | |
| 2002/0041608 A1 | 4/2002 | Choi et al. | |
| 2002/0041634 A1 | 4/2002 | Choi et al. | |
| 2002/0085632 A1 | 7/2002 | Choi et al. | |
| 2002/0095640 A1 | 7/2002 | Arad et al. | |
| 2002/0152441 A1 | 10/2002 | Senda et al. | |
| 2003/0021341 A1 | 1/2003 | Vigil et al. | |
| 2003/0067992 A1 * | 4/2003 | Karaoguz et al. | 375/265 |
| 2004/0028076 A1 | 2/2004 | Strolle et al. | |
| 2004/0066738 A1 | 4/2004 | Stopler | |
| 2004/0158798 A1 * | 8/2004 | Senda et al. | 714/792 |
| 2004/0207757 A1 | 10/2004 | Fimoff | |
| 2004/0240590 A1 | 12/2004 | Cameron et al. | |
| 2005/0041748 A1 | 2/2005 | Choi et al. | |
| 2005/0041749 A1 | 2/2005 | Choi et al. | |
| 2005/0074069 A1 | 4/2005 | Choi et al. | |
| 2005/0129132 A1 | 6/2005 | Choi et al. | |
| 2005/0254605 A1 * | 11/2005 | Holmes et al. | 375/341 |
| 2006/0002464 A1 | 1/2006 | Choi et al. | |
| 2006/0039503 A1 | 2/2006 | Choi et al. | |
| 2008/0049146 A1 | 2/2008 | Choi et al. | |
| 2008/0049874 A1 | 2/2008 | Choi et al. | |
| 2008/0063104 A1 * | 3/2008 | Gardner et al. | 375/262 |
| 2008/0089408 A1 | 4/2008 | Choi et al. | |

FOREIGN PATENT DOCUMENTS

| | | |
|---|---|---|
| KR | 10-1999-0065541 | 8/1999 |
| KR | 10-0253000 | 1/2000 |
| KR | 10-2000-0018531 | 4/2000 |
| KR | 10-2000-0028757 | 5/2000 |
| WO | 02/03678 | 1/2002 |

OTHER PUBLICATIONS

Richard Citta et al., "ATSC Transmission System: VSB Tutorial," Montreuz Symposium, Jun. 1997.

Bretl, U.S. Appl. No. 60/198,014, Apr. 18, 2000.

S. Benedetto et al. "A soft-input soft-output maximum a posteriori (MAP) module to decode parallel and serial concatenated codes" TDA progress report 42-127, Nov. 15, 1996.

\* cited by examiner

-o- : TCM encoder alone
-*- : FIG. 5A 1/2 convolutional encoder+TCM encoder
-x- : FIG. 5B 1/2 convolutional encoder+TCM encoder

US 8,320,485 B2

VSB TRANSMISSION SYSTEM

CROSS-REFERENCE TO RELATED APPLICATIONS

This application is a continuation of U.S. application Ser. No. 11/767,411, filed Jun. 22, 2007, now U.S. Pat. No. 7,613, 246, which is a continuation of U.S. application Ser. No. 10/898,465, filed Jul. 23, 2004, now U.S. Pat. No. 7,298,786, issued on Nov. 20, 2007, which is a continuation of U.S. application Ser. No. 09/968,083, filed Oct. 1, 2001, now U.S. Pat. No. 7,460,606, issued on Dec. 2, 2008, which claims the benefit of earlier filing date and right of priority to Korean Patent Application No. 2000-57823 filed on Oct. 2, 2000, the contents of which are hereby incorporated by reference herein in their entirety.

BACKGROUND OF THE INVENTION

1. Field of the Invention

The present invention relates to a digital communication system, and more particularly, to a vestigial sideband (VSB) modulation transmission system including a TCM (Trellis-Coded Modulation) encoder and an additional ½ rate convolutional encoder having a superior state transition property when connected to the TCM encoder in the system.

2. Background of the Related Art

The TCM coded 8-VSB modulation transmission system has been selected as a standard in 1995 for the U.S. digital terrestrial television broadcasting, and the actual broadcasting incorporating the system has started since the second half of the year 1998.

In general, a digital communication system performs error correcting processes to correct the errors occurred at the communication channels. The total amount of the transmitting data is increased by such error correcting coding processes since it creates additional redundancy bits added to the information bits. Therefore, the required bandwidth is usually increased when using an identical modulation technique. Trellis-coded modulation (TCM) combines multilevel modulation and coding to achieve coding gain without bandwidth expansion. Also an improved signal to noise ratio can be achieved by using the trellis-coded modulation (TCM) technique.

FIG. 1A and FIG. 1B illustrate a typical TCM encoder used in a typical ATSC 8-VSB system and corresponding set partitions used by the TCM encoder. According to the FIG. 1A, an input bit $d_0$ is output as $c_1$ and $c_0$ after trellis-coded modulation, and then a subset is selected among (−7,1), (−5,3), (−3,5), and (−1,7). Thereafter, an input bit $d_1$ selects a signal within the selected subset. In other words, when $d_1$ and $d_0$ are inputted, one of eight signals (−7, −5, −3, −1, 1, 3, 5, 7) is selected by c2, c1, and c0 generated by the TCM encoder. d1 and d0 are called an uncoded bit and a coded bit, respectively.

FIG. 1B illustrates the set partitions used by the TCM encoder used in the ATSC 8-VSB system. Eight signal levels are divided into four subsets, each of which including two signal levels. Two signals are assigned to each subset such that the signal levels of each subset are as far as possible from each other as shown in FIG. 1B.

SUMMARY OF THE INVENTION

Accordingly, the present invention is directed to a VSB transmission system and a method for encoding an input signal in the VSB transmission system that substantially obviates one or more problems due to limitations and disadvantages of the related art.

An object of the present invention is to provide a VSB transmission system that can transmit data reliably even at a lower signal to noise ratio and can have an optimal state transition property when connected to the TCM encoder by using a ½ rate convolutional encoder as an additional error correcting encoder in the system.

Another object of the present invention is to provide a method for encoding an input signal in a VSB modulation transmission system enabling a data sender to achieve more reliable data transmission at a lower signal to noise ratio and to have an optimal state transition property of a ½ convolutional encoder, which is concatenated to the TCM encoder for error correcting in the system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a vestigial sideband (VSB) modulation transmission system includes a convolutional encoder encoding an input signal; a trellis-coded modulation (TCM) encoder encoding the convolutionally encoded input signal; and a signal mapper mapping the trellis-coded input signal to generate a corresponding output signal.

In another aspect of the present invention, a vestigial sideband (VSB) modulation transmission system includes a ½ rate convolutional encoder encoding an input signal to generate first and second output signals; a ⅔ rate trellis-coded modulation (TCM) encoder encoding the first and second output signals to generate third, forth and fifth output signals; and a signal mapper mapping the third, forth, and fifth output signals.

There are three different types of ½ rate convolutional encoders that can be used in this aspect of the present invention. The first type includes a plurality of multipliers, each ith multiplier multiplying the input signal by a constant $k_i$ to generate an ith multiplier value; a plurality of memories, a first memory storing the previous second output value as a first memory value and each i+1th memory storing an i+1th memory value obtained by adding an ith memory value stored in a ith memory and the ith multiplier value; and a plurality of adders, each ith adder adding the ith memory value and the ith multiplier value, where i=1, 2, 3, . . . , n, and a n+lth memory value stored in a n+lth memory is the second output signal.

The second type of the ½ rate convolutional encoder includes a first memory storing the input signal as a first memory value; a second memory storing the first memory value as a second memory value; a first adder adding the input signal and the second memory value to generate the first output signal; and a second adder adding the input signal and the first and second memory values to generate the second output signal.

Finally, the third type of the ½ rate convolutional encoder includes a first memory storing the previous second output value as a first memory value; an adder adding the input signal and the first memory value; and a second memory storing a result from the adder as a second memory value, the second memory value being the second output signal.

In another aspect of the present invention, a method for encoding an input signal in a vestigial sideband (VSB) modulation transmission system includes the steps of encoding the input signal by the convolutional encoder; encoding the convolutionally encoded input signal by the TCM encoder; and generating a final output signal my mapping the trellis-coded input signal.

In a further aspect of the present invention, a method for encoding an input signal in a vestigial sideband (VSB) modulation transmission system includes the steps of generating first and second output signals by encoding the input signal using the ½ convolutional encoder; generating a third, forth, and fifth output signals by encoding the first and second output signals using the ⅔ rate TCM encoder; and generating a final output signal by mapping the third, forth, and fifth output signals.

The second output signal can be generated using three different methods in the last aspect of the present invention described above. The first method for generating the second output signal includes the steps of multiplying the input signal by a constant $k_i$ to generate an ith multiplier value for i=1, 2, 3 . . . n; storing the previous second output value as a first memory value; and storing an i+lth memory value obtained by adding an ith memory value and the ith multiplier value for i=1, 2, 3 . . . n, where the second output signal is an n+lth memory value.

The second method for generating the second output signal includes the steps of storing the input signal as a first memory value; storing the first memory value as a second memory value; generating the first output signal by adding the input signal and the second memory value; and generating the second output signal by adding the input signal and the first and second memory values.

Finally, the third method for generating the second output signal includes the steps of storing the previous second output value as a first memory value; adding the input signal and the first memory value; storing the value resulted from the adding step as a second memory value; and outputting the second memory value as the second output signal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings;

FIG. 5B is used.

DETAILED DESCRIPTION OF THE INVENTION

Reference will now be made in detail to the preferred embodiments of the present invention, examples of which are illustrated in the accompanying drawings.

Figure 1A:
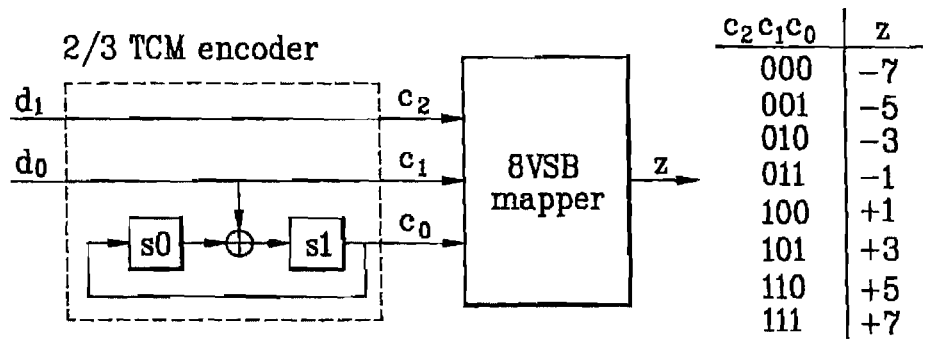
FIG. 1A illustrates a typical trellis-coded modulation (TCM) encoder used in a ATSC 8VSB transmission system according to the related art.
Figure 1B:
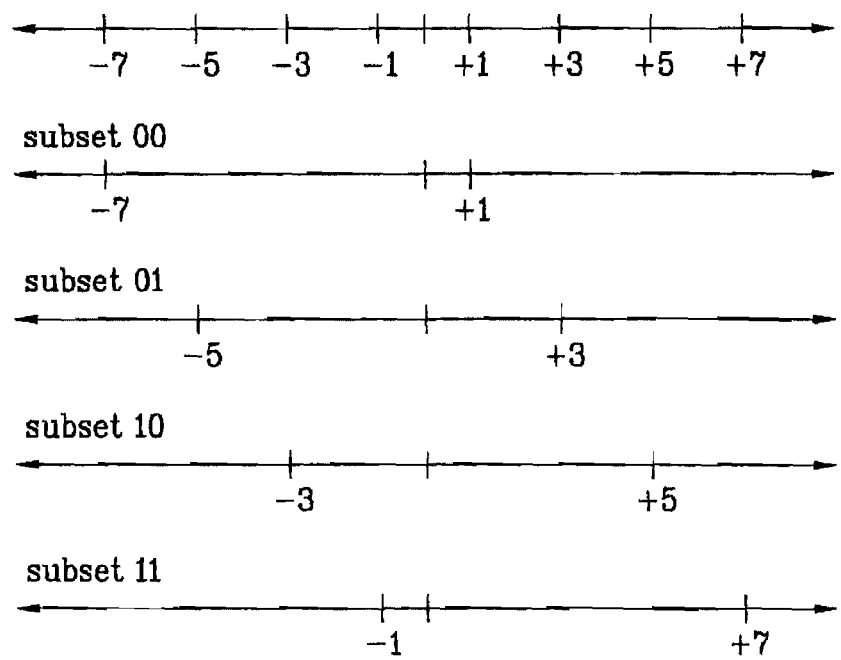
FIG. 1B illustrates set partitions used by a typical TCM encoder of a ATSC 8VSB transmission system according to the related art.
Figure 2:
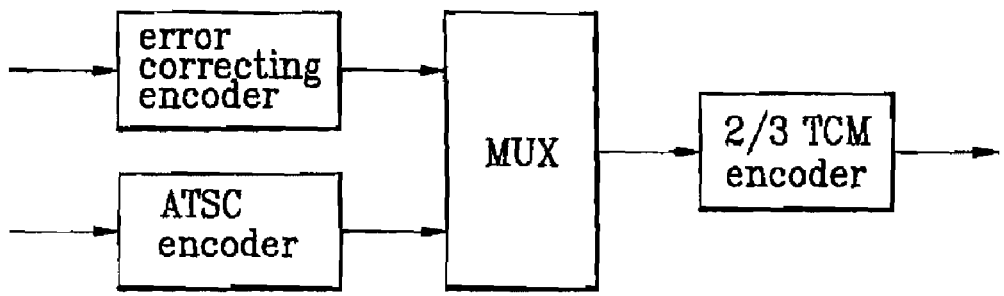
FIG. 2 illustrates an error correcting encoder concatenated to a ⅔ rate TCM encoder in a ATSC 8-VSB transmission system according to the present invention.

FIG. 2 illustrates a VSB transmission system in which an error correcting encoder is concatenated to a ⅔ rate TCM encoder according to the present invention. By adding an additional error correcting encoder to the ⅔ rate TCM encoder in the VSB system, it is possible to achieve a reliable data transmission even at a lower signal to noise ratio than that of the conventional ATSC TCM coded 8VSB system. In the present invention, a ½ rate convolutional encoder is used for the additional error correcting encoder. In addition, a multiplexer located between the error correcting encoder and the ⅔ rate TCM encoder classifies the data received from each of the error correcting encoder and a ATSC encoder and inputs each data to the TCM encoder. The additional error-corrected data will be regarded as an error by the ATSC receiver and will be discarded.

Figure 3A:
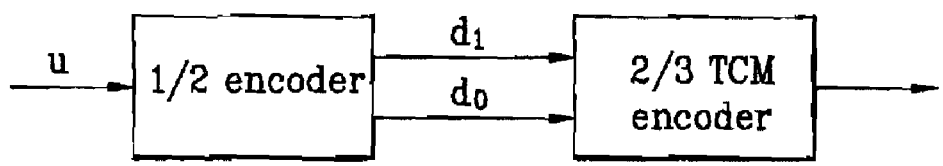
FIG. 3A illustrates a ½ rate convolutional encoder concatenated to a ⅔ TCM encoder to be used as an error correcting encoder in a ATSC 8-VSB transmission system according to the present invention.
Figure 3B:
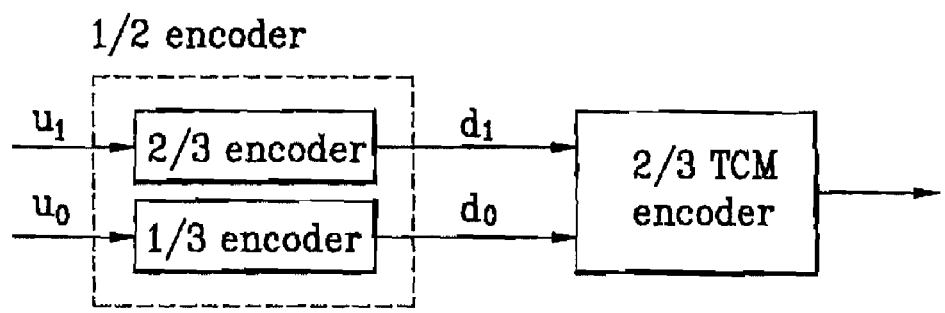
FIG. 3B illustrates ⅔ and ⅓ rate convolutional encoders used as an error correcting encoder in a ATSC 8-VSB transmission system according to the present invention.

FIGS. 3A and 3B illustrate a ½ rate encoder used as an additional error correcting encoder shown in FIG. 2. According to FIG. 3A, an input bit u is processed in the ½ rate encoder to generate two output bits $d_1$ and $d_0$, and these are inputted to a ⅔ rate TCM encoder. In FIG. 3B, each of ⅔ and ⅓ rate encoders is connected to a ⅔ rate TCM encoder. Since the bit error rate of uncoded bits $u_1$ is lower than that of a coded bit $u_0$, the encoder having a higher code rate is used for $u_1$, and the other encoder is used for $u_0$. This will compensate the difference between two input bits $u_0$ and $u_1$. In addition, the ⅔ and ⅓ rate encoders can be considered as being a ½ rate encoder since it has three input bits and six output bits. Thus, combining encoders having different code rates can reduce the bit error rate of the whole system. As a result, the additional encoder can be any one of the ½ rate encoder and the combination of the ⅔ rate encoder and the ⅓ rate encoder shown in FIG. 3A and FIG. 3B, respectively. By adding the additional encoder, the performance of the system can be enhanced, and this will be shown later in this section. Considering the signal mapping of the TCM encoder, the error correcting encoder must be designed so that it has the optimal state transition property when connected to the TCM encoder.

Figure 4:
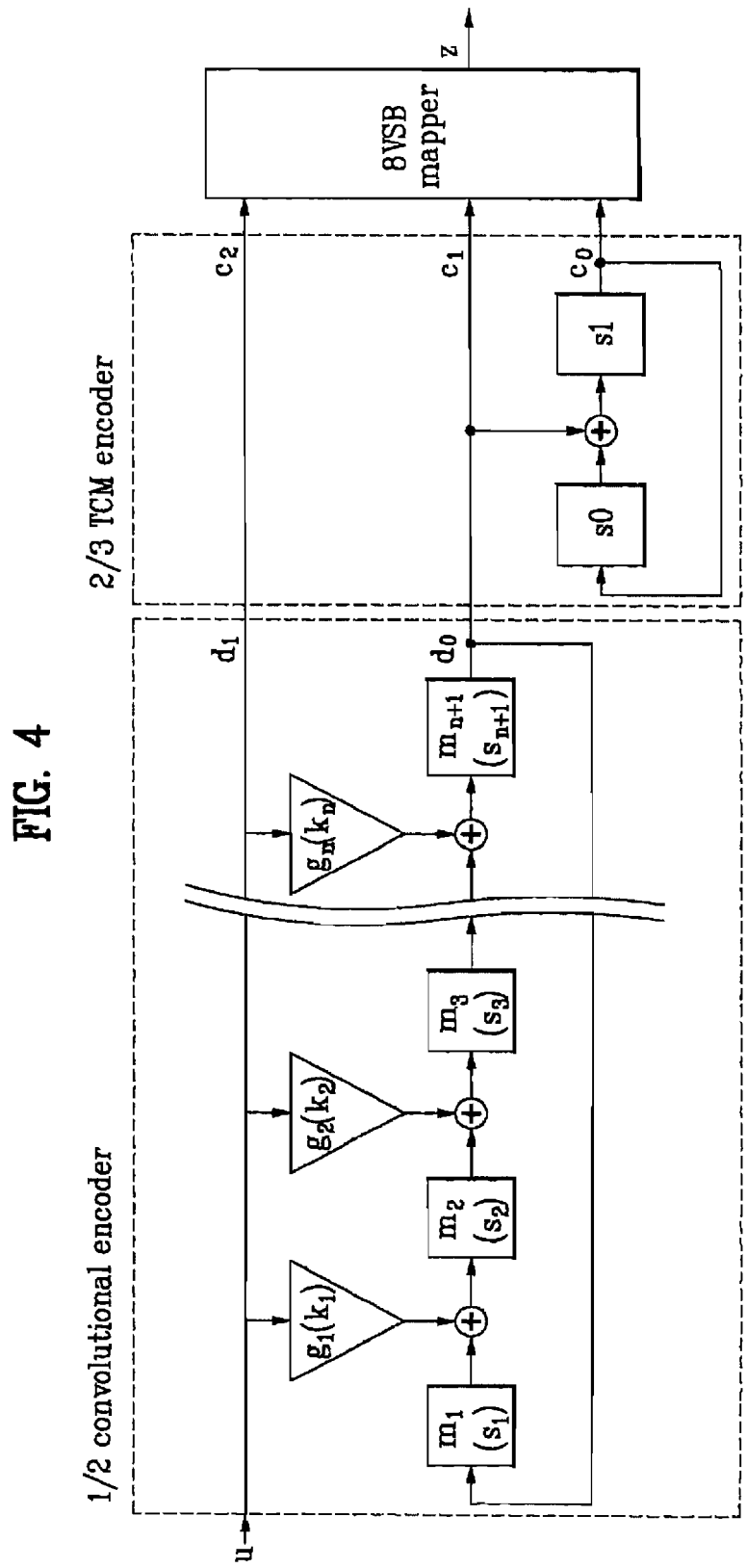
FIG. 4 illustrates a first type of a ½ rate convolutional encoder concatenated to a ⅔ TCM encoder in a ATSC 8-VSB transmission system according to the present invention.

FIG. 4 illustrates a first type of a ½ rate convolutional encoder concatenated to a ⅔ TCM encoder in a VSB transmission system according to the present invention. The ½ rate convolutional encoder receives an input bit u and generates a first output bit $d_1$ by bypassing u. A second output bit $d_0$ is the value of the N+1th memory $m_{i+1}$. The ½ rate convolutional encoder includes N multipliers, N adders, and N+1 memories. The first memory $m_1$ stores a previous second outputs value, the first multiplier $g_1$ multiplies the input bit u by a first constant $k_1$, and the first adder adds the outputs from $g_1$ and $m_1$. Similarly, each i+1th memory $m_{i+1}$ stores the output from the ith adder, the ith multiplier g, multiplies the input bit u by an ith constant $k_i$, and the ith adder adds the outputs from g, and $m_i$, where i=2, 3, 4, . . . , N. Finally, the N+1th memory $m_{i+1}$ stores the output from the Nth adder. Then the value stored in $m_{i+1}$ is output as a second output bit (current). In addition, the second output bit (current) is feedback to the first memory $m_1$ for calculating a next second output value. N can be greater than or equal to two and can be determined as one wishes to design the system. As shown in the FIG. 4, the ½ rate convolutional encoder receives u and outputs $d_0$ and $d_1$. $d_0$ and $d_1$ then become the output bits $c_1$ and $c_2$ of the TCM encoder. Therefore, when $d_1 d_0$=00, $c_2 c_1$=00, and the corresponding 8VSB symbol becomes 7($c_2 c_1 c_0$=001) or −5($c_2 c_1 c_0$=001) depending on the value of $c_0$. $c_0$ is equal to the value stored in a second memory $s_1$ and is obtained by adding $s_0$ and $d_0$, where $s_0$ is the value stored in a first memory. The 8VSB symbols for $d_1 d_0$=01, 10, 11 are (−3,−1), (1,3), and (5,7), respectively.

Figure 5A:
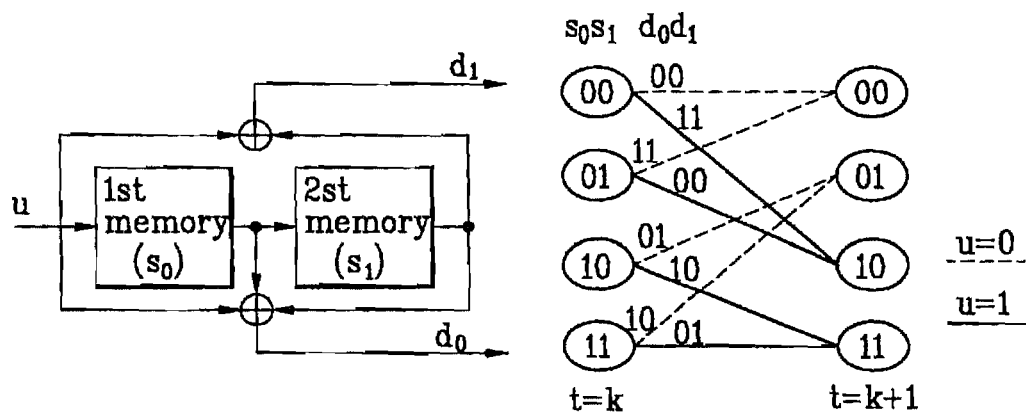
FIG. 5A illustrates a second type of a ½ rate convolutional encoder used in a ATSC 8-VSB transmission system according to the present invention and its corresponding state transition diagram.

FIG. 5A illustrates a non-systematic ½-rate convolutional encoder used in a VSB system according to the present invention and its corresponding state transition diagram. This type of encoder is often used because of its long free-distance property. In the state transition diagram shown in FIG. 5A, a transition from the state $s_k$ at i=k to the state $s_{k+1}$ at i=k+1 is denoted as a branch, and the value indicated above each branch corresponds to the output of the branch. The probability of receiving a signal r when a signal z having zero mean and variance $c_2$ is sent through a AWGN channel can be obtained by using the equation:

$$p(r|z) = \frac{1}{\sqrt{2\pi\sigma^2}} \exp\left(\frac{-|r-z|^2}{2\sigma^2}\right) \quad \text{[Equation 1]}$$

where z represents a branch output. A branch metric is a probability measure of receiving r when the branch output z is sent from the encoder. It is an Euclidean distance between r and z, and can be obtained by the following equation:

Branch Metric ∝ Log(p(r/z))=|r−z|². [Equation 2]

A metric corresponding to a path including $S_0$, $S_1$, $S_2$, . . . , $S_k$ can be calculated by the equation:

$$\text{Path Metric} = \sum_{t=0}^{t=k} \text{Branch Metric.} \quad \text{[Equation 3]}$$

The path metric is an accumulated value of the branch metrics of the branches included in a path and represents a probability of the path.

As shown in the state transition diagram of FIG. 5A, two branches are divided from each $S_k$, and two branches are merged into each $S_{k+1}$. A viterbi decoder that decodes a convolutional code first calculates the path metrics of the two paths that are merging into each state and selects the path having a lower path metric. The path metric selected using this technique represents the lowest path metric of the paths starting from an initial state {t=0} to each $S_k$.

When selecting a path between two paths merging into one state, the probability of the path selection becomes higher as the difference between the metrics of the two paths is larger. Since a path metric represents the sum of metrics of the branches included in a path, it is desired to have the largest difference between the branch metrics in order to maximize the performance of the encoder.

The ½ rate convolutional encoder shown in FIG. 5A includes a first memory for storing an input bit u as a first memory value $s_0$; a second memory for storing $s_0$ as a second memory value $s_1$; a first adder for adding u and $s_1$; and a second adder for adding u, $s_0$, and $s_1$. The output from the first and second adders becomes a first output bit $d_1$ and a second output bit $d_0$.

Figure 5B:
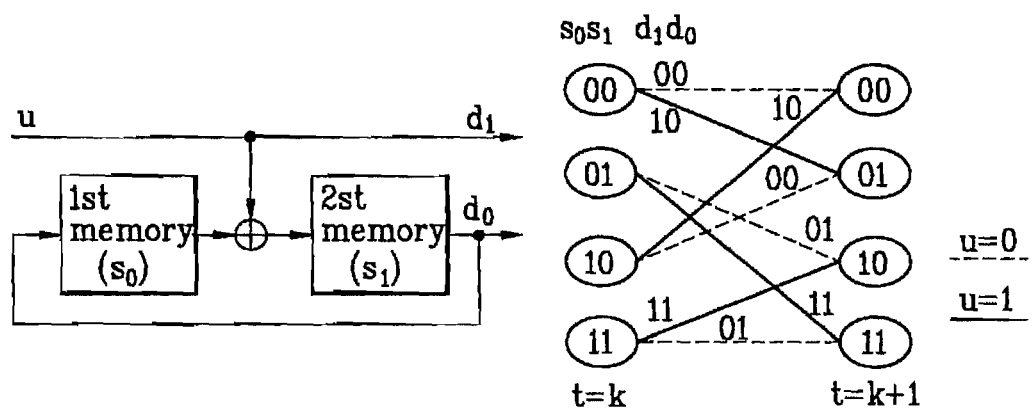
FIG. 5B illustrates a third type of ½ rate convolutional encoder used in a ATSC 8-VSB system according to the present invention and its corresponding state transition diagram.

FIG. 5B illustrates a systematic convolutional encoder used in a VSB transmission system and its corresponding state transition diagram. A first output bit $d_1$ is generated by bypassing an input bit u, and a second output bit $d_0$ is generated by adding and delaying u. The systematic ½ rate convolutional encoder includes a first memory for storing a previous second output bit value as a first memory value $s_0$, an adder for adding the input bit u and $s_0$, and a second memory for storing the output from the adder as a second memory value $s_1$ and outputting $s_1$ as the second output bit $d_0$.

According to FIG. 5A, the combination of the branch outputs dividing from a state at t=k or merging into a state at t=k+1 is (00,11) or (01,10). According to the trellis-coded modulation fundamental, the encoder has a better performance as the difference between branch metrics of the combination is larger. A larger difference between the branch metrics means that the corresponding Euclidean distance is larger. The Euclidean distance of (00,11) is larger than that of (01,10). When the output is either 01 or 10, the error often occurs during the path selection. Therefore, it is desired to have the combination of the branch outputs of (00,10) and (01,11) so that the difference between the branch metrics is large. This is shown in FIG. 5B. Therefore, the convolutional encoder of FIG. 5B has a better encoding performance than that of FIG. 5A.

Figure 6:
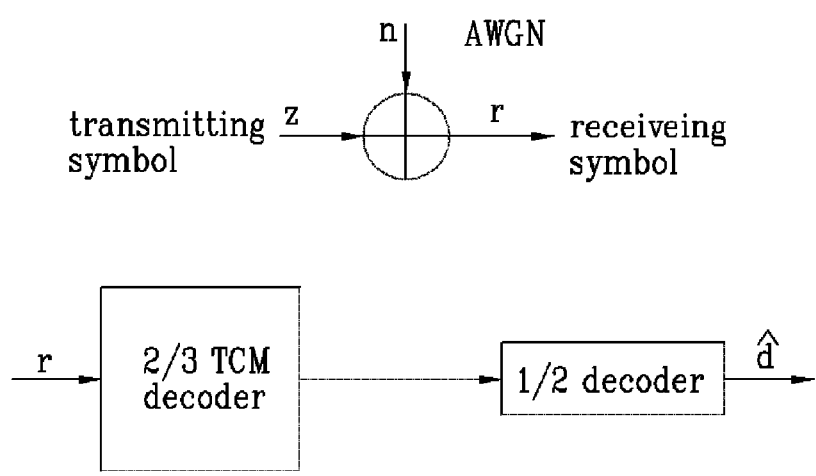
FIG. 6 illustrates a VSB receiving system corresponding to a ATSC 8-VSB transmission system according to the present invention.

FIG. 6 illustrates a VSB receiving system corresponding to the VSB transmission system of the present invention.

Figure 7A:
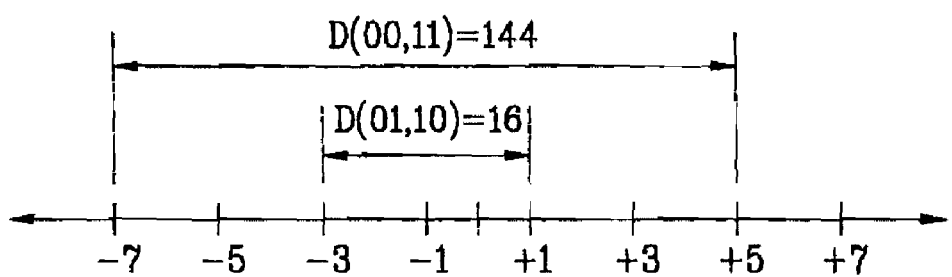
FIG. 7A illustrates Euclidean distances of a set of output signals generated from the ½ rate convolutional encoder shown in FIG. 5A.
Figure 7B:
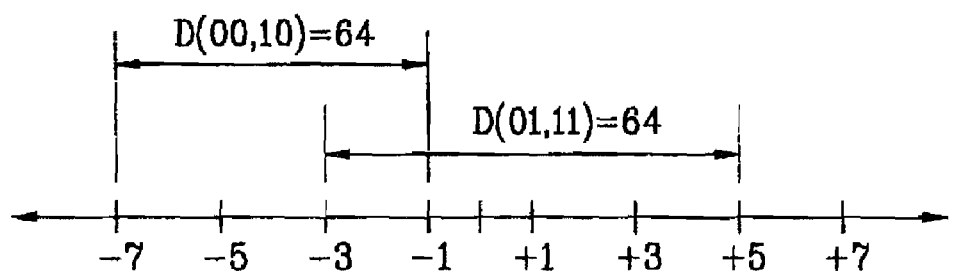
FIG. 7B illustrates Euclidean distances of a set of output signals generated from the ½ rate convolutional encoder shown in FIG. 5B.

FIG. 7A and FIG. 7B illustrate Euclidean distances corresponding to the output combinations generated from the encoders shown in FIG. 5A and FIG. 5B, respectively. As it can be shown from both figures, the Euclidean distances of (00,10) and (01,11) are much larger than the that of (01,10). Therefore, the convolutional encoder of FIG. 5B has a better performance when connected to the ⅔ rate TCM encoder in the VSB transmission system.

Figure 8:
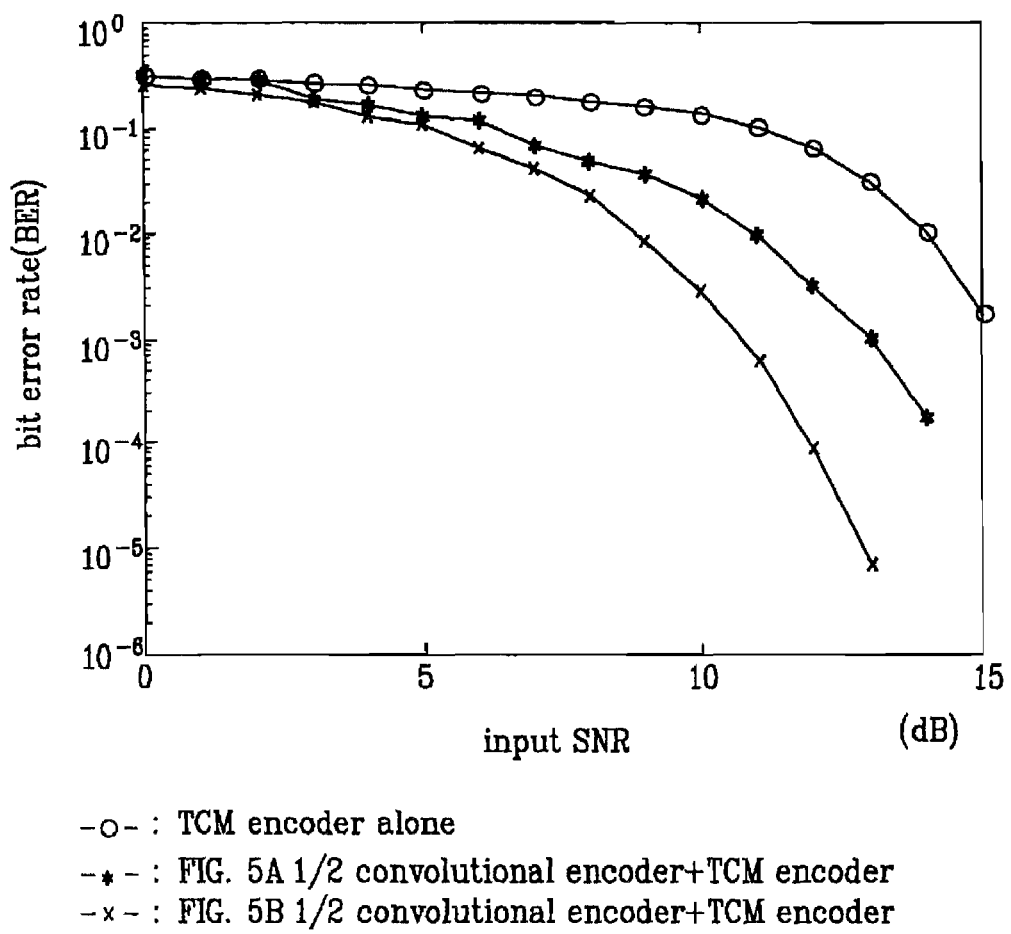
FIG. 8 illustrates performances of ATSC 8-VSB transmission systems when each of the ½ rate convolutional encoders shown in FIG. 5A

FIG. 8 illustrates performances of ATSC 8-VSB transmission systems when each of the convolutional encoders shown in FIG. 5A and FIG. 53 is used in the system. For a bit error rate of 1e-3, the signal to noise ratio is reduced by 2 dB and 4 dB when the convolutional encoders shown in FIG. 5A and FIG. 5B are used as an additional error-correcting encoder in the VSB system. Therefore, a bit error rate can be reduced by using a ½ rate convolutional encoder as an outer encoder of the TCM encoder, and the encoder shown in FIG. 5B has a better bit error rate reduction property.

In conclusion, data can be transmitted at a lower signal to noise ratio by concatenating a ½ rate convolutional encoder to the TCM encoder in a VSB transmission system according the present invention.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of processing a digital television (DTV) signal in a DTV receiver, the method comprising:

receiving digital broadcast data, wherein the digital broadcast data result from receiving one input data bit in first data and performing convolutional encoding on the one input data bit to output two convolutional encoded data bits using a ½ convolutional encoder that comprises either an even component encoder or an odd component encoder, multiplexing the convolutional encoded data with second data that is input to the multiplexer through a different path from the first data via a multiplexer, the second data including at least audio or video data, receiving and performing trellis encoding on the multiplexed convolutional encoded data and second data using a ⅔ trellis encoder such that two input data bits are trellis encoded into three output data bits, and mapping the three output data bits into 8-level symbols in a mapper;

demodulating the received digital broadcast data in a demodulator; and trellis decoding the demodulated digital broadcast data in a trellis decoder.

2. The method of claim 1, wherein the first data includes at least audio or video data.

3. A digital television (DTV) receiver comprising:

receiving means for receiving digital broadcast data, wherein the digital broadcast data result from receiving one input data bit in first data and performing convolutional encoding on the one input data bit to output two convolutional encoded data bits using a ½ convolutional encoder that comprises either an even component encoder or an odd component encoder, multiplexing the convolutional encoded data with second data that is input to the multiplexer through a different path from the first data via a multiplexer, the second data including at least audio or video data, receiving and performing trellis encoding on the multiplexed convolutional encoded data and second data using a ⅔ trellis encoder such that two input data bits are trellis encoded into three output data bits, and mapping the three output data bits into 8-level symbols in a mapper;

a demodulator for demodulating the received digital broadcast data; and a trellis decoder for trellis decoding the demodulated digital broadcast data.

4. The DTV receiver of claim 3, wherein the first data includes at least audio or video data.

* * * * *